US006696206B2

(12) United States Patent
Ehrmann

(10) Patent No.: US 6,696,206 B2
(45) Date of Patent: Feb. 24, 2004

(54) LITHOGRAPHY MASK CONFIGURATION

(75) Inventor: Albrecht Ehrmann, Krailing (DE)

(73) Assignee: Infineon Technologies AG, Munich (DE)

( * ) Notice: Subject to any disclaimer, the term of this patent is extended or adjusted under 35 U.S.C. 154(b) by 156 days.

(21) Appl. No.: 09/982,200

(22) Filed: Oct. 17, 2001

(65) Prior Publication Data

US 2002/0081498 A1 Jun. 27, 2002

(30) Foreign Application Priority Data

Oct. 17, 2000 (DE) .......................... 100 51 466

(51) Int. Cl.$^7$ ................................. G03F 9/00
(52) U.S. Cl. ........................................... 430/5
(58) Field of Search ................... 430/5, 30, 22; 355/53, 55

(56) References Cited

U.S. PATENT DOCUMENTS 5,883,703 A * 3/1999 Knirck et al. .................. 355/55
6,356,340 B1 * 3/2002 Spence ......................... 355/53

FOREIGN PATENT DOCUMENTS

DE 199 47 174 A1 4/2000

* cited by examiner

Primary Examiner—S. Rosasco
(74) Attorney, Agent, or Firm—Laurence A. Greenberg; Werner H. Stemer; Gregory L. Mayback

(57) ABSTRACT

A reflective membrane mask is composed at least partially of an electrically conductive material and is aligned horizontally over a sample to be processed. Bending of the reflective membrane mask is compensated for by disposing an electrode plate above the membrane mask and parallel to it, which electrode plate is provided with a number of electrodes that are electrically isolated from one another. Electrostatic forces, that correct for any deformation of the membrane mask, are produced by applying an electrical potential difference between each electrode and the membrane mask.

3 Claims, 2 Drawing Sheets

LITHOGRAPHY MASK CONFIGURATION

BACKGROUND OF THE INVENTION

Field of the Invention

The present invention relates to a lithography mask configuration, in particular for EUV lithography, which is used in the production of semiconductor components.

A mask that complies with very stringent requirements relating to the production tolerances is required in order to use extreme ultraviolet (EUV) lithography for the production of semiconductor components. In this type of lithography, light is not passed through the mask, rather the mask is illuminated from the side of the sample that is to be processed lithographically. The light is reflected, or is not reflected, in a manner corresponding to the structured surface of the mask. The specifications for such masks must therefore be complied with very accurately. In the case of a mask area in the order of magnitude of square centimeters, the vertical discrepancy from the plane of the surface must not exceed 100 nm. Furthermore, it is necessary to ensure that the mask can be aligned very accurately with respect to the object to be processed, during the lithography process. Thus, until now, masks composed of thick substrates with low thermal coefficients of expansion have been used, produced from a material such as Zerodur or an ultra-low-expansion glass. Owing to the large mass of these substrates, the mask is bent downward in the center due to the force of gravity when it is aligned horizontally. The bending of the mask cannot be avoided completely even when using very robust substrates. The deformation of the mask leads to lithography inaccuracies that are no longer tolerable.

SUMMARY OF THE INVENTION

It is accordingly an object of the invention to provide a lithography mask configuration which overcomes the above-mentioned disadvantages of the prior art methods of this general type, which complies with the stringent requirements needed for by EUV lithography.

With the foregoing and other objects in view there is provided, in accordance with the invention, a lithography mask configuration. The configuration includes a reflective membrane mask composed at least partially of an electrically conductive material; an electrode plate disposed over the reflective membrane mask and has a number of electrodes electrically isolated from one another and able to be electrically connected individually; and a device for applying a respective electrical potential difference between each of the electrodes individually and the reflective membrane mask. According to the invention, a configuration containing the reflective membrane mask and the electrode plate is used as the mask. The reflective mask is in the form of the membrane mask, in which the actual mask is formed by a membrane fitted in a frame. The membrane is produced at least partially from an electrically conductive material. In the simplest case, the entire membrane is an electrically conductive material, for example a conductive sheet or a thin electrically conductive polysilicon layer.

The membrane mask is aligned horizontally above a sample to be processed. The membrane of the mask thus bends downwards owing to its natural weight, so that the distance to the object disposed underneath it is reduced in the central area. This is compensated for in the configuration according to the invention by disposing an electrode plate above the membrane mask and parallel to it, which electrode plate is provided with a number of electrodes, which are electrically isolated from one another and can be electrically connected individually. Electrostatic forces are produced via suitable devices for applying a respective electrical potential difference between each individual one of the electrodes and the membrane mask, and the electrostatic forces have a locally restricted effect in an area surrounding each individual electrode. It is thus possible to correct the deformation of the membrane mask by application of suitable potentials to such an extent that the required tolerances are met.

In accordance with an added feature of the invention, a monitoring device is provided for monitoring a physical shape of the reflective membrane mask. The monitoring device includes a light source for projecting light onto the reflective membrane mask and a light detector for detecting the light reflected by the reflective membrane mask.

Other features which are considered as characteristic for the invention are set forth in the appended claims.

Although the invention is illustrated and described herein as embodied in a lithography mask configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
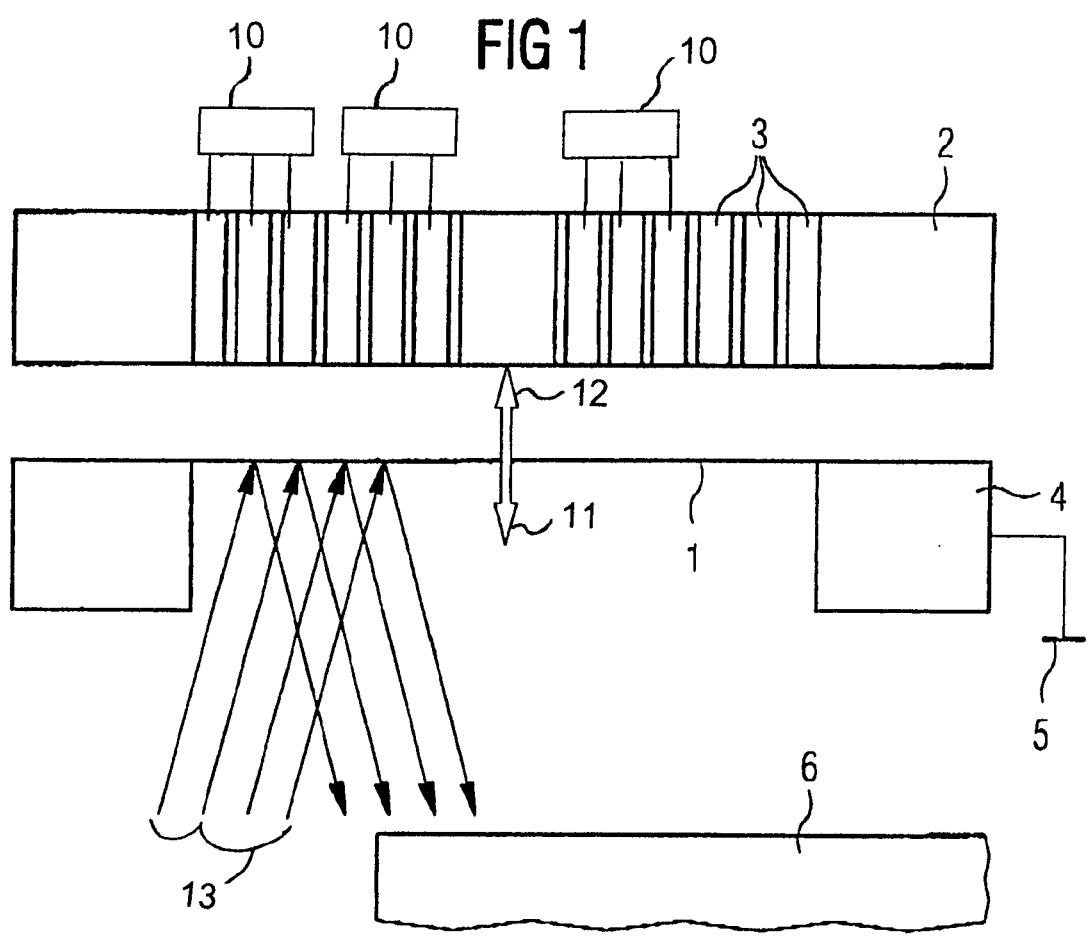
FIG. 1 is a diagrammatic, cross-sectional view of a configuration according to the invention.

Referring now to the figures of the drawing in detail and first, particularly, to FIG. 1 thereof, there is shown a cross-sectional view through a horizontal configuration of a membrane mask 1. An electrode plate 2, with individual electrodes 3, is disposed above the membrane mask 1, and parallel to it. The membrane mask 1 preferably has a holder 4 that is in the form of a frame and holds a membrane, which is at least partially composed of an electrically conductive material, such that the membrane is deformed as little as possible, from the start. An electrical connection is located on or in the frame and connects the electrically conductive membrane to the relevant electrical connection of the voltage supply; in this example, this is the connection to ground 5. The electrodes 3 each have an electrical voltage with respect to ground applied to them, for which purpose suitable voltage generation devices 10 are provided, preferably electronic circuits by which different controllable potentials are produced. Since the electrodes 3 are electrically isolated from one another, electric fields can be produced between the membrane and the electrodes 3. The force of gravity indicated by an arrow 11 pointing downward in FIG. 1 is thus largely compensated for by the electrostatic forces (as per the opposite arrow 12, pointing upward). A sample 6 that is to be processed lithographically is fitted under the configuration and can, for example, be illuminated with the EUV radiation via the reflective membrane mask 1, in the direction indicated by four parallel arrows 13. The use of a number of the electrodes 3 in the electrode plate 2, which may all have different potentials applied to them, also makes it possible to compensate for any irregularity of the membrane, for example any ripple, resulting from the production techniques, in addition to the bending of the membrane due to the force of gravity.

Figure 2:
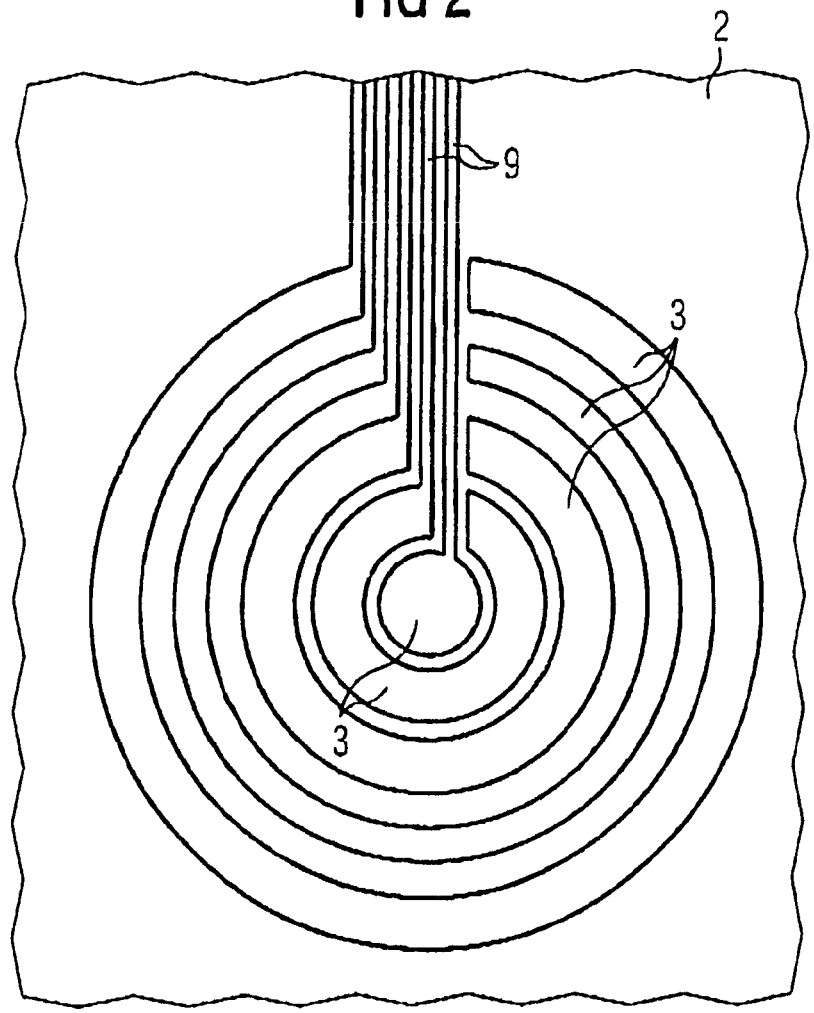
FIG. 2 is a plan view of an example of a suitable structure of electrodes.

FIG. 2 shows a plan view of the electrode plate 2. The electrodes 3 can, as illustrated in FIG. 1, either pass through the electrode plate 2 completely in the vertical direction, or the electrodes 3 can be applied and structured just to the upper face of the insulating electrode plate 2. An upper face of the electrode plate 3 is in this case preferably disposed opposite the membrane mask 1. FIG. 2 illustrates suitable structuring of the electrodes 3 for these various configuration options. In this case, the electrodes 3 are structured as circular rings disposed concentrically with respect to one another. The circular rings are interrupted, so that leads 9, which are routed to the electrical connection, can be provided such that they are electrically isolated from one another. The structure of the electrodes 3 shown here takes account of the fact that any undesirable three-dimensional deformation of the membrane will in most case be radially symmetrical.

Figure 3:
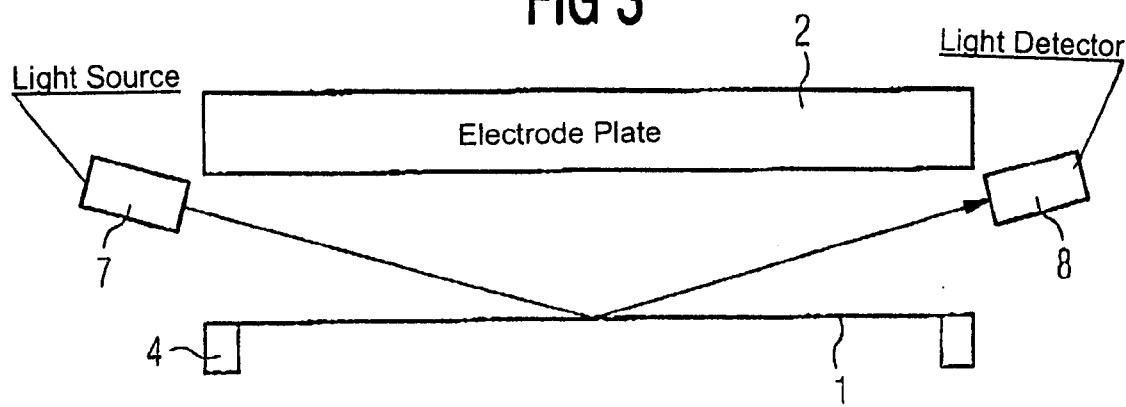
FIG. 3 is a block diagram of a layout for a further preferred exemplary embodiment.

FIG. 3 illustrates a particularly preferred refinement of the configuration, in which the correction, resulting from the electrostatic attraction, to the physical shape of the membrane is monitored by, preferably, optical devices. A light source 7, preferably a laser, is fitted for this purpose here, and directs a light beam onto the surface of the membrane. A reflected beam is received by a light detector 8. The direction of the emitted beam can be varied continuously. The direction of the reflected beam, which is thus varied in a manner that can be calculated, can be used to determine whether the surface of the membrane is aligned to be exactly flat. The optical monitoring can, as shown here, be carried out from the upper face of the membrane mask 1; however, it is also possible to dispose the light source 7 and the light detector 8 underneath the membrane mask 1. The monitoring of the physical shape of the membrane mask 1 must then be carried out, if appropriate, before the lithographic illumination of the sample 6, which is not fitted underneath the configuration until the light source 7 and the light detector 8 have been removed once again. In principle, any medium capable of propagation may be used for non-contacting monitoring of the membrane shape. Electromagnetic waves at different wavelengths, ultrasound or the like may be used instead of light. The advantage of a laser is that the transmitted beam is very well focused and it is possible to define the beam direction very accurately. The potentials applied to the electrodes 3 can be corrected via a feedback loop in the electronic circuit as a function of the signal emitted from the light detector 8, so that flat alignment of the membrane can be achieved as accurately as possible. If the thin membrane is excessively heated by the influence of the EUV radiation, the configuration according to the invention can have a cooling gas passed through it.

I claim:

1. A lithography mask configuration, comprising:

a reflective membrane mask composed at least partially of an electrically conductive material;

an electrode plate disposed at a distance from and over said reflective membrane mask and having a number of electrodes electrically isolated from one another and able to be electrically connected individually; and a device for applying a respective electrical potential difference between each of said electrodes individually and said reflective membrane mask.

2. The configuration according to claim 1, including a monitoring device for monitoring a physical shape of said reflective membrane mask.

3. The configuration according to claim 2, wherein said monitoring device includes a light source for projecting light onto said reflective membrane mask and a light detector for detecting the light reflected by said reflective membrane mask.

* * * * *